United States Patent [19]

Lam et al.

[11] Patent Number: 6,039,788
[45] Date of Patent: Mar. 21, 2000

[54] MELTING AND CASTING OF HIGH PURITY CHROMIUM WITH CONTROLLED OXYGEN CONTENT

[75] Inventors: Raymond K. F. Lam, Park Ridge; Charles E. Melin, Bogota, both of N.J.; Guiseppe Colella, Orangeburg, N.Y.

[73] Assignees: Sony Corporation, Tokyo, Japan; Materials Research Corporation, Orangeburg, N.Y.

[21] Appl. No.: 09/057,932

[22] Filed: Apr. 9, 1998

Related U.S. Application Data

[62] Division of application No. 08/822,055, Mar. 24, 1997, Pat. No. 5,866,067.

[51] Int. Cl.⁷ .................................................. C22B 34/32
[52] U.S. Cl. .............................. 75/623; 29/34 R; 420/590
[58] Field of Search ............................... 75/623; 29/34 R; 420/590

[56] References Cited

U.S. PATENT DOCUMENTS

| | | | |
|---|---|---|---|
| 3,640,700 | 2/1972 | Suzuki et al. ........................... | 75/10 C |
| 4,504,310 | 3/1985 | Boulier ..................................... | 75/27 |
| 5,092,921 | 3/1992 | Kobayashi et al. ..................... | 75/623 |
| 5,259,866 | 11/1993 | Kobayashi et al. ..................... | 75/623 |
| 5,476,248 | 12/1995 | Kobayashi et al. ..................... | 266/171 |

FOREIGN PATENT DOCUMENTS

| | | | |
|---|---|---|---|
| 1617026 | 12/1990 | U.S.S.R. ................................. | 75/623 |

OTHER PUBLICATIONS

WPIDS Abstract 79–191,22B of JP 54–13,408.
WPIDS Abstract 88–274,362 of JP 63–199,832.

*Primary Examiner*—Melvyn Andrews
*Attorney, Agent, or Firm*—Wood, Herron & Evans, L.L.P.

[57] ABSTRACT

The present invention relates to a method of manufacturing high purity chromium suitable for deposition onto a semiconductor wafer or other substrate by sputtering. The process increases productivity, expands melting capability and provides consistent high purity chromium by reducing contamination by the dissolution of crucible material. The present invention provides for the addition of chromium oxide ($Cr_2O_3$) to control oxygen content in chromium thereby producing high purity chromium ingots and protecting the ceramic crucibles from chemical attack by the liquid chromium.

16 Claims, 4 Drawing Sheets

MELTING AND CASTING OF HIGH PURITY CHROMIUM WITH CONTROLLED OXYGEN CONTENT

This is a division of application Ser. No. 08/822,055, filed Mar. 24, 1997 now U.S. Pat. No. 5,866,067.

Field of the Invention

The present invention relates to a method of manufacturing high purity chromium suitable for deposition onto a semiconductor wafer or other substrate.

BACKGROUND OF THE INVENTION

Previous methods of consolidating high purity chromium ingots were inconsistent, leading to high levels of scrap in the manufacturing process. Since liquid chromium is highly reactive, it tends to dissolve the crucible used in the manufacture which leads to high levels of Zr, Si, Fe and Al impurities. In the prior methods the oxygen level of the chromium ingot could not be accurately controlled, the oxygen level of the ingot was dependent upon the oxygen level of the charge material and degradation of the crucible. Oxygen content in electrolytic chromium is difficult to control and is unreliable when product requirements necessitate specific levels and tolerances.

Therefore, it is an objective of the present invention to provide a method of obtaining high purity chromium in a consistent and cost effective manner. It is another objective of the invention to manufacture controlled oxide chromium ingots without dependence upon electrolytic sources of high oxide chromium.

SUMMARY OF THE INVENTION

The present invention is a process for reducing contamination caused by the dissolution of crucible material into the liquid chromium thereby reducing scrap, increasing productivity and expanding melting capability while providing consistent high purity chromium such as MARZ grade chromium. MARZ is a trademark of Materials Research Corporation and the purity levels are shown in TABLE 1.

TABLE 1

| Impurities | Maximum Values (PPM) |
| --- | --- |
| N | 50.00 |
| O | 3000.00 |
| Al | 40.00 |
| Cu | 20.00 |
| Fe | 100.00 |
| Mg | 10.00 |
| Mo | 10.00 |
| Ni | 30.00 |
| Pb | 30.00 |
| Si | 100.00 |
| Ti | 10.00 |
| Zr | 30.00 |

The present invention provides for the addition of chromium oxide ($Cr_2O_3$) to control oxygen content in the chromium melt while minimizing chemical attack of the ceramic crucible by the liquid chromium. The above and other objects and advantages of the present invention shall be apparent from the accompanying specification.

BRIEF DESCRIPTION OF THE DRAWINGS

Accompanying and forming a part of this disclosure are drawing FIG. 1–6 including.

DETAILED DESCRIPTION OF SPECIFIC EMBODIMENTS

Figure 1:
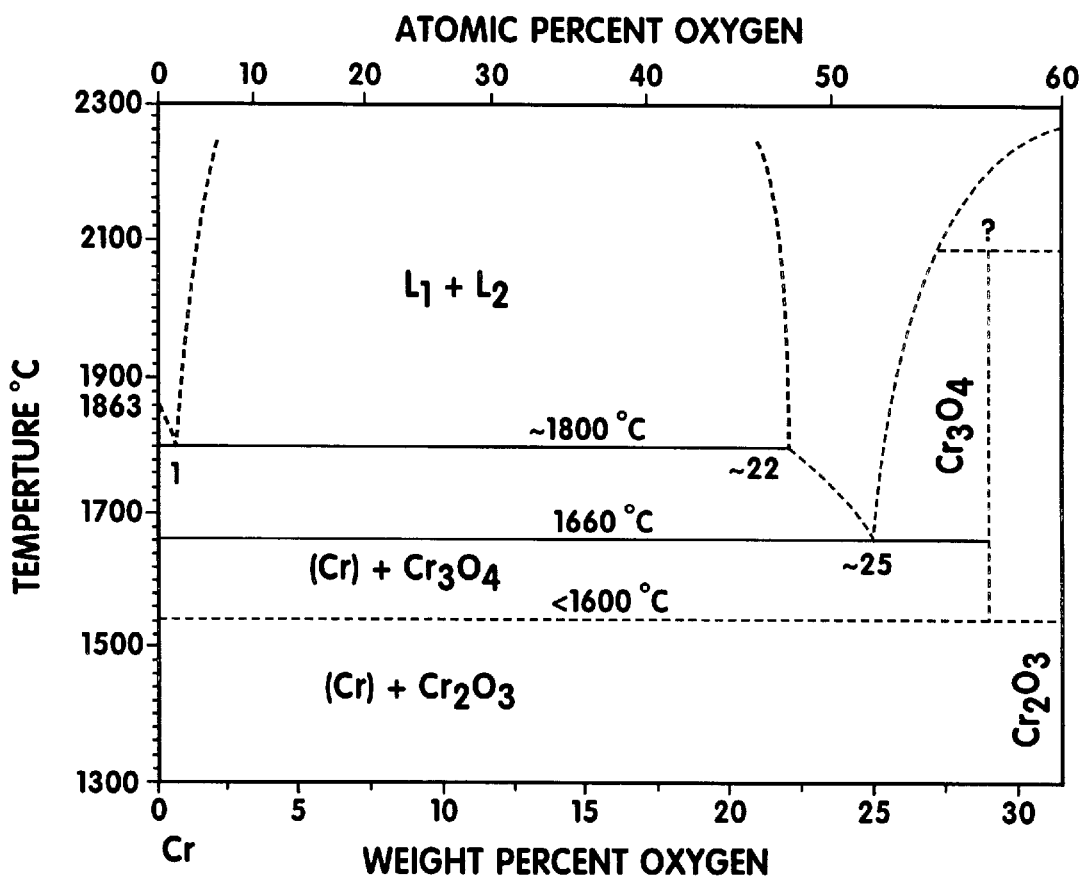
FIG. 1 is a phase diagram of the Cr-O system.

High purity chromium ingots which may subsequently be fabricated into sputtering targets are formed in accordance with the principles of the present invention. In accordance with the present invention, high purity ingots with an oxygen content between approximately 1,400 and 2,800 ppm have been produced by using chromium charge material with an average oxygen level of 162 ppm with an addition of chromium oxide. FIG. 1 is a phase diagram of the CR-O System showing the melting point of low weight percent oxygen and chromium to be approximately 1,860° C.

Equilibrium chemical reactions between liquid chromium and ceramic crucibles composed of $ZrO_2$, $SiO_2$, $Al_2O_3$, and $Fe_2O_3$ are represented as:

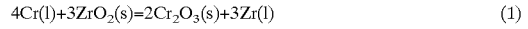
$$4Cr(l)+3ZrO_2(s)=2Cr_2O_3(s)+3Zr(l) \tag{1}$$

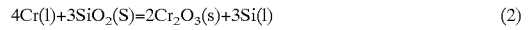
$$4Cr(l)+3SiO_2(S)=2Cr_2O_3(s)+3Si(l) \tag{2}$$

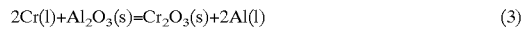
$$2Cr(l)+Al_2O_3(s)=Cr_2O_3(s)+2Al(l) \tag{3}$$

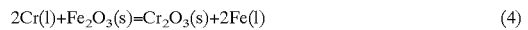
$$2Cr(l)+Fe_2O_3(s)=Cr_2O_3(s)+2Fe(l) \tag{4}$$

where (l) and (s) indicate liquid phase and solid phase, respectively. According to the JANAF Thermochemical Tables, incorporated herein by reference, thermodynamic data of Gibbs free energy of formation are calculated per mole of $O_2$. Chemical stability of the oxides in the presence of liquid chromium at high temperatures is listed in the descending order:

$ZrO_2$

$Al_2O_3$

$SiO_2$

$Cr_2O_3$

$Fe_2O_3$

The standard Gibbs free energy of reaction, $\Delta G°_R$, for Reaction (1) and (4) are written as:

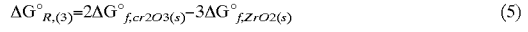
$$\Delta G°_{R,(3)}=2\Delta G°_{f,Cr2O3(s)}-3\Delta G°_{f,ZrO2(s)} \tag{5}$$

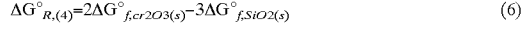
$$\Delta G°_{R,(4)}=2\Delta G°_{f,Cr2O3(s)}-3\Delta G°_{f,SiO2(s)} \tag{6}$$

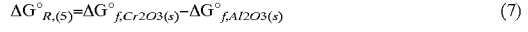
$$\Delta G°_{R,(5)}=\Delta G°_{f,Cr2O3(s)}-\Delta G°_{f,Al2O3(s)} \tag{7}$$

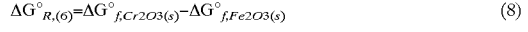
$$\Delta G°_{R,(6)}=\Delta G°_{f,Cr2O3(s)}-\Delta G°_{f,Fe2O3(s)} \tag{8}$$

Where $\Delta G°_f$ is the Gibbs free energy of formation. Negative free energy of reaction is noted for reaction with $Fe_2O_3$ at all temperatures. The reaction of $Cr_2O_3$ with $ZrO_2$ shows the highest positive free energy of reaction. Reactions of $Cr_2O_3$ with $Al_2O_3$ and $SiO_2$ have similar positive values of free energy of reaction at temperatures above 1,200° C.

As chromium oxide is added to the molten liquid during Cr melting, the activity of the Cr melt is increased. Therefore, the activities of impurities of Zr(l), Si(l), Al(l) and Fe(l) must be decreased to maintain the constant value of equilibrium constant K. The chemical reactions (1), (2), (3) and (4) are driven to the reactant side reducing the dissolution of $ZrO_2$, $SiO_2$, $Al_2O_3$ and $Fe_2O_3$ and thereby reducing impurity levels in the liquid chromium.

It has been determined by analyzing impurity data of chromium as a function of oxygen level that zirconium impurity levels increase as the oxygen content in the ingot is decreased. It has been determined that the zirconium impurity level exceeds 30 ppm if the oxygen content is below 1,190 ppm. The zirconium level may be predicted by the equation:

$$Zr[ppm]=8^6(O_{ingot}[ppm])^{-1.7635}$$

Where $Zr[ppm]$ and ($O_{ingot}[ppm]$) are zirconium impurity level in ppm and oxygen content in ppm, respectively.

Similarly, it has been found that aluminum impurity levels can be held below 40 ppm if the oxygen content is higher than 1,007 ppm. Al impurity levels are determined by the equation:

$$Al[ppm]=-19.945Ln(O_{ingot}[ppm])+165.1$$

Where $Al[ppm]$ and ($O_{ingot}[ppm]$) are aluminum impurity level in ppm and oxygen content in ppm, respectively.

Based on historical sampling of melts, it has been determined that iron impurity is generally less than 100 ppm O.

The levels of silicon impurity appear erratic with respect to oxygen content. Silicon impurities exceeded 100 ppm at 825 ppm O, 1,557 ppm O and 2,459 ppm O. No trend of the silicon impurity level could be distinguished with respect to oxygen level. Molybdenum impurity levels were similarly erratic. Extremely high Mo impurity levels of 480 ppm was found at 1,280 ppm oxygen content. The levels of molybdenum impurity exceeded 10 ppm at oxygen levels of 776 ppm and 1,007 ppm oxygen.

The increased levels of impurities results from chemical attack by the liquid chromium of the MgO-stabilized zirconia crucible (manufactured by Howmet Corp.) and foreign objects in the charge materials. The MgO-stabilized zirconia crucible consisted of 95 weight percent $ZrO_2$, 2.8 weight percent MgO, 1.0 weight percent $SiO_2$, 0.4 weight percent $Al_2O_3$, 0.2 weight percent $TiO_2$, 0.1 weight percent $Fe_2O_3$, 0.2 weight percent CaO and 0–0.5 weight percent $Y_2O_3$. The physical properties of the crucible are as follows: Modulus of rupture (MOR) (room temperature) 3000 psi (minimum), bulk density 3.9 g/cm³ (minimum), apparent density 5.4 g/cm³ (minimum), apparent porosity 18–25% and 5–25% stabilization (cubic $ZrO_2$).

It was determined that the Zr, Al, Si and Fe impurities are contamination from the crucible and that the Mo impurity was introduced with the charge material. In view of the above data analysis, it has been determined that oxygen level in the liquid chromium strongly effects the chemical attack of the MgO-stabilized zirconia crucible which causes contamination. Suitable oxygen levels for each are shown in TABLE 2.

TABLE 2

| Impurity Type | Suitable Oxygen Content (ppm) |
| --- | --- |
| Zr | greater than 1,190 |
| Al | greater than 1,007 |
| Fe | [all levels] |
| Si | [not definable] |
| Mo | [not definable] |

In order to obtain high purity chromium having less than 30 ppm Zr, 40 ppm Al and 100 ppm Fe, thereby meeting the requirements for MARZ grade chromium indicated in TABLE 1, (above) the suitable operating conditions for oxygen content are greater than 1,000 ppm oxygen, preferably between about 1,190 ppm oxygen and 2,500 ppm oxygen. For alternate grades or higher oxygen requirements, large oxide additions can be utilized to obtain higher oxygen levels, for example, 6000 ppm O.

Melting Operation

The melting operation of the present invention is performed in a semi-continuous vacuum melter (SCVM) with induction heating. The oxygen levels may be controlled in a range of ±250 ppm for chromium ingots by the addition of chromium oxide powders and an understanding of the relationship between oxygen levels in the melt and the dissolution of impurities from the MgO-stabilized zirconia crucible. The subsequent sputtering targets are 99.9% pure chromium with typical dimensions of 4.75 inches wide by 22 inches long by 0.5 inches thick. The melting operation includes the steps of: conditioning the crucible, charging the crucible with an initial chromium oxide and chromium charge, heating and melting the charge, filling the crucible with additional chromium charges and casting the high purity chromium into a steel mold to form an ingot. The ingot may then be formed to the shape of the sputtering target by hot extrusion followed by machining.

The preparation of high purity chromium for targets was preceded by conditioning the crucible with several wash melts of 99.9% chromium. These wash melts condition the MgO-stabilized zirconia crucible to remove impurities and ensure acceptable purity of the melted material. In preparing the examples set forth below the crucible was conditioned with four wash melts of 99.9% pure chromium flakes.

The crucible used was a 180 pound capacity MgO stabilized Zr crucible having an internal diameter of 7.88 inches, a depth of 16 inches and a capacity of 12.8 liters. The crucible is loaded one-half to two-thirds full with chromium and the $Cr_2O_3$ oxide powder. The furnace chamber is then pumped down to a vacuum level of less than 20 microns and with a chamber leak rate equal to or less than 0.05 microns per second. The mold is pre-heated to greater than 100° C. prior to application of power to the furnace.

The main furnace power is then applied to melt the chromium. The SCVM used was manufactured by PVFT Inc. (Serial No. 5911). The SCVM had a melt chamber diameter of 5 feet. The power supply was produced by Ajax Magnathermic (Serial No. MK84820A) with a power input rating of 480 volts, 168 KVA at 230 Amps, from a 3 phase 60 Hertz supply. The power output rating is 400 volts, 9250 Amps and 150 KW in a single phase at 1,100 to 3,300 Hertz. Power should be applied to the induction coils gradually at first. After eight to ten minutes of heating, the furnace chamber should be backfilled 0.1 to 0.5 ATM of argon. If any signs of molten chromium exist prior to backfilling, the chamber should be backfilled immediately to prevent sublimation of the chromium and coating of the furnace windows. As the chromium begins to melt the crucible should be tilted forward in increments of 5°–10° to control bridging. Bridging is the fusing of a solid metal layer of the charge material above a lower molten metal layer. When the bridge falls into the molten metal or a hole large enough for additions appears in the bridge layer, the crucible is returned to the vertical position. When the charge chamber pressure is between 10–200 millitorr the charger door is opened and additions to the crucible are made through the hole in the bridge. The amount of the additions is limited to the amount of material which will melt down and fall into the molten metal, several additions may be necessary.

Argon exchanges should be conducted several times during the melting step typically after each time the charger door is opened. In order to perform an argon exchange the chamber should be backfilled with argon then returned to the original operating pressure.

Figure 2:
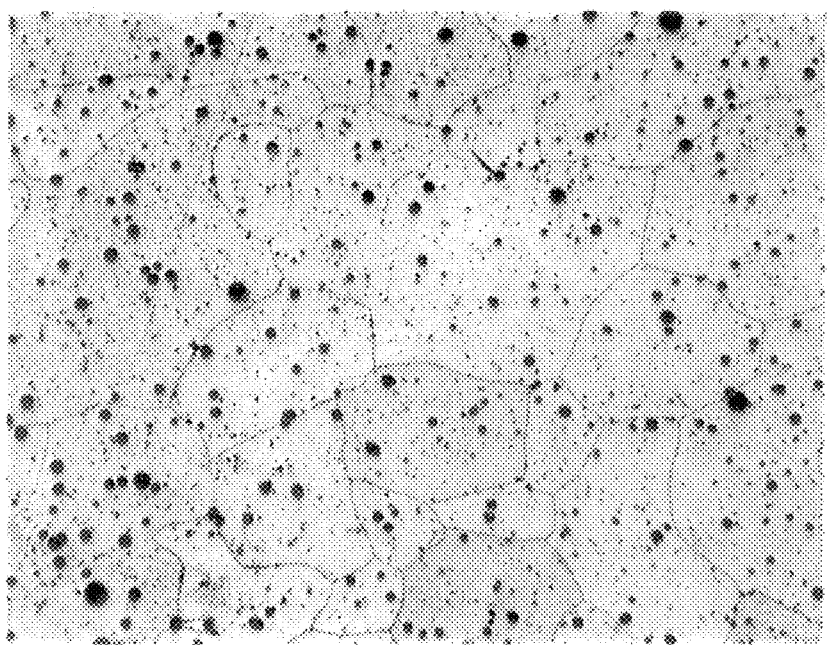
FIG. 2 is a photomicrograph showing the microstructure of the cast chromium of the present invention at 25× magnification.
Figure 3:
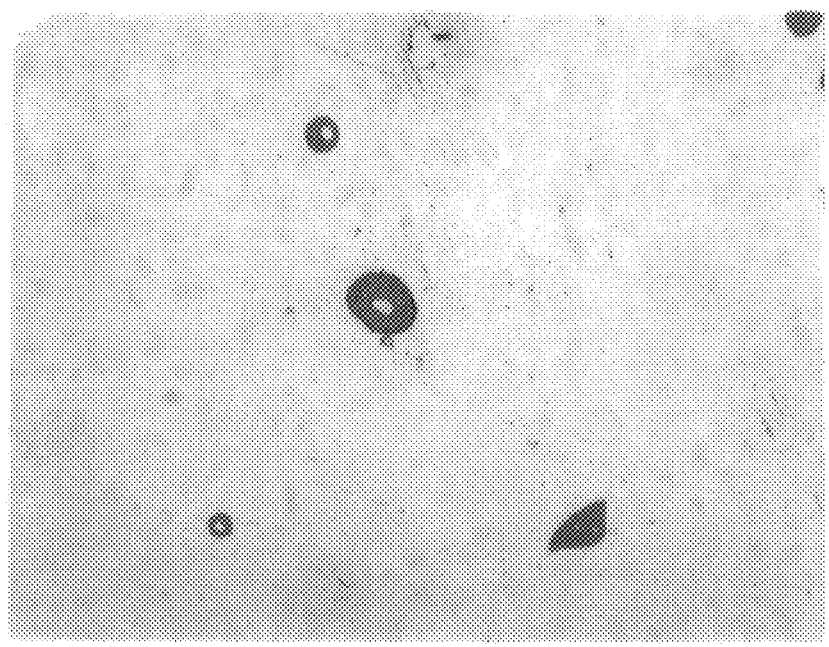
FIG. 3 is a photomicrograph showing oxide particle in the cast chromium of the present invention at 400× magnification.

Once all of the charge materials are molten the casting of the billet can be performed. The power applied to the furnace should be decreased to 50%–65% of capacity to prevent super-heating of the liquid chromium. When the material is completely melted the crucible is tilted so that the liquid chromium is 1–2 inches from the pouring lip and power is reduced to 25%–35%. The temperature of the molten chromium should be controlled to between about 1,860–1900° C. (as measured by an optical pyrometer). The molten metal is allowed to warm the lip of the crucible while the furnace chamber is backfilled with argon to 0.1 to 0.5 ATM and the mold is aligned. The first 2–3 inches of the mold should be filled as quickly as possible to reduce splashing. The rest of the mold should be filled as slowly as possible. Once the mold is filled the mold is placed under a ceramic insulator which covers the top of the chromium and helps to control the cooling rate of the ingot. The mold is furnace-cooled for at least 30 minutes then retrieved from the furnace and air cooled. During the casting, the temperature of the exterior surface of the bottom half mold increases rapidly to 620° C. during pouring and decreases to 600° C. in approximately 35 minutes. FIG. 2 is a photomicrograph of the microstructure of the as cast chromium. Large equiaxed grains of chromium with dispersed oxide particles in the grain and in the grain boundaries are observed in the cast ingots. The grain size of the cast chromium varies from 0.3 mm to 1.4 mm. FIG. 3 shows oxide particles with an inner $Cr_3O_4$ phase and an outer $Cr_2O_3$ phase.

Experimental Data

The target oxide levels as well as the charge used to achieve these levels are shown in TABLE 3 (below).

TABLE 3

| Target Oxide Level (ppm) | 99.9% Pure Cr Flake (gram) | Cr Briquette (gram) | Cr Oxide Powder (gram) | Total Weight (gram) |
|---|---|---|---|---|
| wash melt | 62,896 | 0 | 0 | 62,896 |
| 2,200 | 59,375 | 3,125 | 396 | 62,896 |
| 1,400 | 59,375 | 3,125 | 210 | 62,710 |

Four wash melts using virgin 99.9% purity chromium flakes were carried out to clean the 180-lb. MgO-stabilized zirconia crucible. The oxygen level in the wash melts was decreased with each additional melt. As shown in TABLE 4 (below), the oxygen level in the ingot sample was reduced from 1,858 ppm to 686 ppm, to 749 ppm and finally to 421 ppm in the fourth and final wash melt. Due to a failure of the first crucible a second crucible was prepared using the same wash melt technique. The behavior of the second batch of wash melts was similar to that of the first batch of wash melts, however, the oxygen levels were higher because the billets of the first batch of wash melts were remelted in the same sequence. TABLE 4 sets forth the target oxide level, crucible number and ingot oxide level as measured.

The ingot form consisted of a riser containing a high porosity solidification pipe and a bottom billet for production. The riser was 5.75 inches in diameter and 5.625 inches high. The billet itself was 8 inches in diameter and 8.625 inches high. The ingot sample was located 1 inch below the riser and 7.15 inches above the bottom of the billet. Oxygen levels vary slightly through the billet since the solidification front is richer in solute (oxygen). Therefore, the last solidified portion is expected to have the highest level of oxygen. The oxygen is solidified as oxide particles because of the very low solubility of oxygen in chromium at low temperatures.

TABLE 4

| Melt | Target Oxide Level (ppm) | Crucible Number | Ingot Oxide Level (ppm) |
|---|---|---|---|
| 1 | wash #1 | 1 | 1,858 |
| 2 | wash #2 | 1 | 686 |
| 3 | wash #3 | 1 | 749 |
| 4 | wash #3 | 1 | 421 |
| 5 | 2,200 | 1 | 1,990 |
| 6 | 2,200 | 1 | 2,753 |
| 7 | 2,200 | 1 [crucible failure] | NA |
| 8 | wash #1 | 2 | 2,930 |
| 9 | wash #2 | 2 | 1,433 |
| 10 | wash #3 | 2 | 1,092 |
| 11 | wash #4 | 2 | 842 |
| 12 | 1,400 | 2 | 1,420 |
| 13 | 1,400 | 2 | 1,635 |
| 14 | 2,200 | 2 | 2,097 |
| 15 | 2,200 | 2 | 2,305 |

Target Fabrication

A rectangular sputtering target may be formed by hot extrusion into a rectangular plate. After the ingot cools the riser is cut off. The hot extrusion of the chromium ingot was performed by Climax Specialty Metals of Coldwater Michigan. For hot extrusion, the ingot was scalped to remove any oxide scale and then preheated to 2,200° F. for a minimum of three hours. The circumference of the ingot was lubricated with glass powder while the extrusion was performed at a speed of approximately 4 inches per second. The resulting plate is approximately 5.35 inches wide by 0.55 inches thick and approximately 10 feet long. The plate is subsequently machined to the final dimensions required for the sputtering target.

Figure 4:
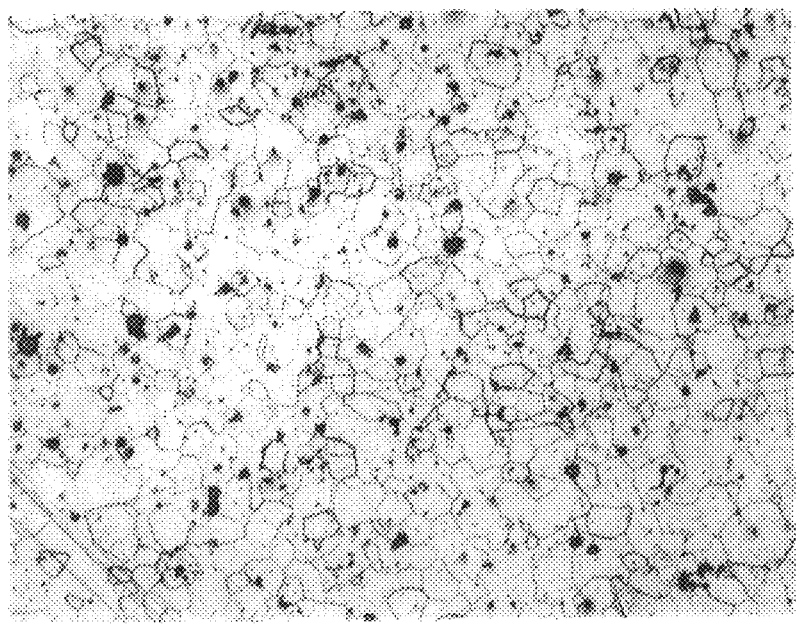
FIG. 4 is a photomicrograph showing the microstructure of the extruded chromium (1345 ppm O) of the present invention across the extrusion direction at 100× magnification.
Figure 5:
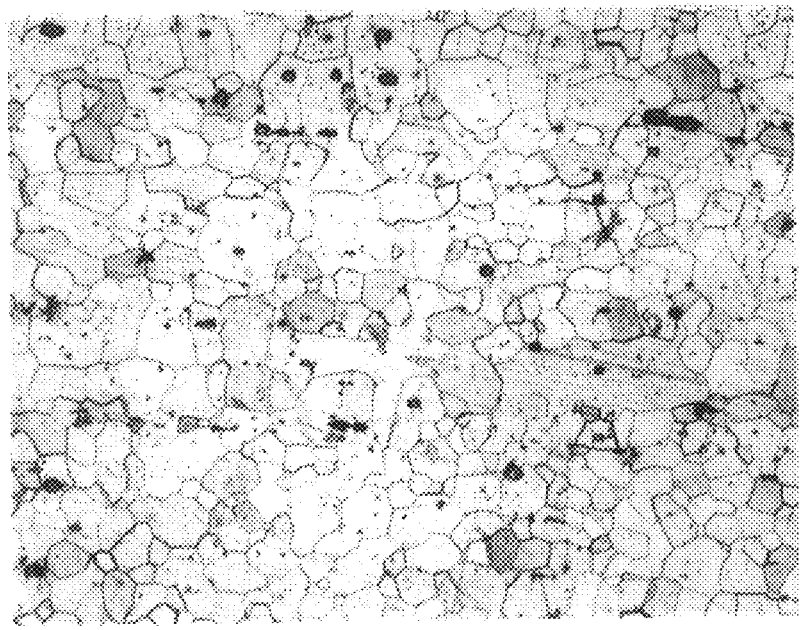
FIG. 5 is a photomicrograph showing the microstructure of the extruded chromium (1345 ppm O) of the present invention along the extrusion direction at 100× magnification.
Figure 6:
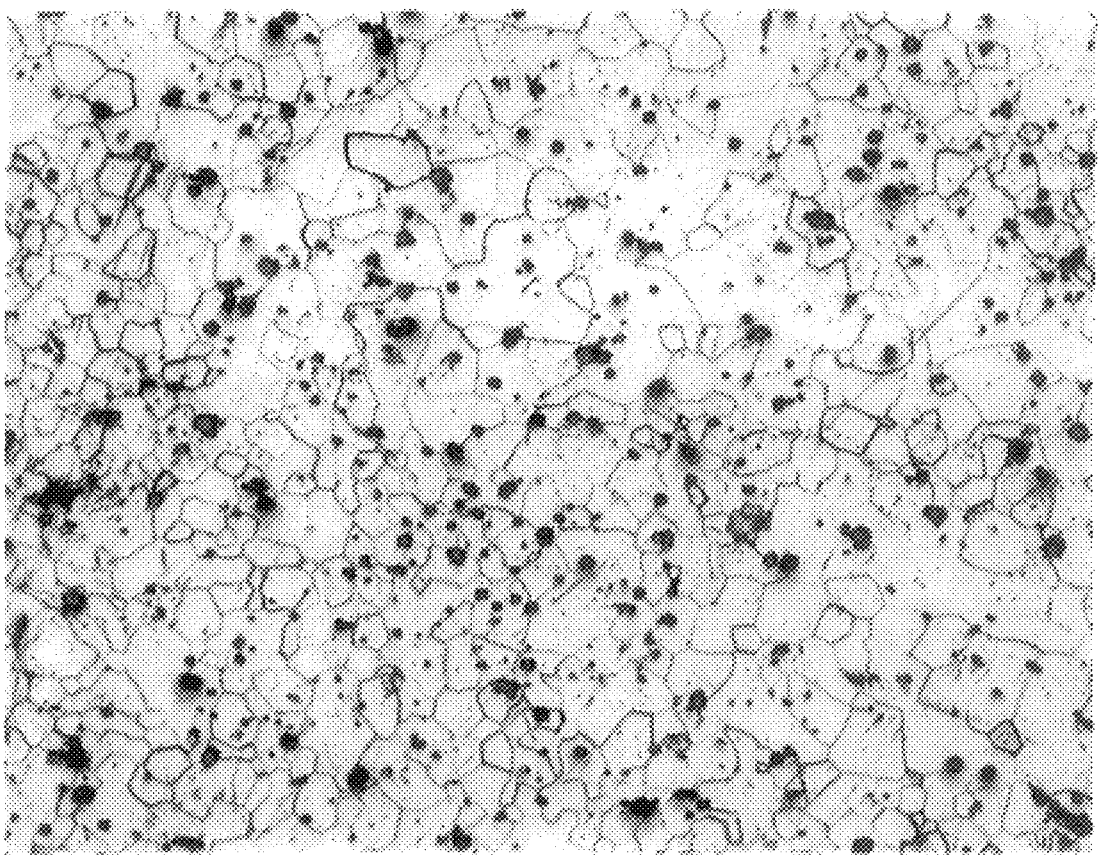
FIG. 6 is a photomicrograph showing the microstructure of the extruded chromium (2481 ppm O) of the present invention at 100× magnification.

FIGS. 4, 5 and 6 show the microstructure of extruded chromium. The extruded chromium has equiaxed grains which are embedded with oxide particles both within the grain and at the grain boundary. The grain size varies from 0.03 mm to 0.08 mm. FIG. 4 shows the microstructure of extruded chromium across the extrusion direction of a 1,345 ppm O ingot sample at 100× magnification. FIG. 5 shows the microstructure of extruded chromium along the extrusion direction of the same 1,345 ppm O ingot sample, similarly at 100× magnification. The grains in the extruded chromium are equiaxed in both directions and elongated grains are not observed. Recrystallization during cooling from the 2,200°

F. extrusion temperature eliminates any elongated crystal structure. FIG. 6 shows the microstructure of extruded chromium of a 2,481 ppm O ingot sample at 100× magnification. FIG. 6 shows a substantially higher population of oxide particles than shown in FIGS. 4 and 5 (1,345 ppm O).

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A method of manufacturing a high purity chromium ingot with controlled O content comprising the steps of:

providing a crucible;

charging said crucible with Cr;

adjusting the O level of the Cr to an elevated value between about 1000 and 6000 ppm by the addition of an oxide of chromium, wherein said elevated value is selected to reduce reaction between liquid Cr and the crucible;

heating said crucible to melt the Cr and the oxide of Cr; and casting an ingot from the melt.

2. The method of claim 1 wherein said elevated value is between about 1,150 and 1,650 ppm.

3. The method of claim 1 wherein said elevated value is between about 1,950 and 2,450 ppm.

4. The method of claim 1 wherein said elevated value is about 1,400 ppm.

5. The method of claim 1 wherein said elevated value is about 2,200 ppm.

6. The method of claim 1 wherein said oxide of Cr is $Cr_2O_3$.

7. The method of claim 1 wherein the heating step gradually increases the temperature of the melt to about 1,860° C.

8. A method of manufacturing a high purity chromium sputtering target blank with controlled O content comprising the steps of:

providing a crucible;

charging said crucible with Cr;

adjusting the O level of the Cr to an elevated value between about 1,000 and 6,000 ppm by the addition of an oxide of chromium, wherein said elevated value is selected to reduce reaction between the Cr melt and the crucible;

heating said crucible to melt the Cr and the oxide of Cr;

casting an ingot from the melt; and hot extruding a sputtering target blank from the ingot.

9. The method of claim 1 wherein said elevated value is between about 1,150 and 1,650 ppm.

10. The method of claim 1 wherein said elevated value is between about 1,950 and 2,450 ppm.

11. The method of claim 1 wherein said elevated value is about 1,400 ppm.

12. The method of claim 1 wherein said elevated value is about 2,200 ppm.

13. The method of claim 1 wherein said oxide of Cr is $Cr_2O_3$.

14. The method of claim 1 wherein the heating step gradually increases the temperature of the melt to about 1,860° C.

15. The method of claim 1 wherein the hot extrusion step is performed at approximately 2,200° F.

16. The method of claim 1, further comprising the step of machining the sputtering target blank into a sputtering target.

* * * * *